(12) United States Patent
Xu

(10) Patent No.: US 9,741,774 B2
(45) Date of Patent: Aug. 22, 2017

(54) DISPLAY APPARATUS

(71) Applicant: BOE TECHNOLOGY GROUP CO., LTD., Beijing (CN)

(72) Inventor: Minghong Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/907,493

(22) PCT Filed: May 12, 2015

(86) PCT No.: PCT/CN2015/078747
§ 371 (c)(1),
(2) Date: Jan. 25, 2016

(87) PCT Pub. No.: WO2016/119332
PCT Pub. Date: Aug. 4, 2016

(65) Prior Publication Data
US 2016/0380034 A1 Dec. 29, 2016

(30) Foreign Application Priority Data

Jan. 27, 2015 (CN) .......................... 2015 1 0039575

(51) Int. Cl.
*H01L 27/32* (2006.01)
*G02F 1/157* (2006.01)
(Continued)

(52) U.S. Cl.
CPC ...... *H01L 27/3232* (2013.01); *G02F 1/13378* (2013.01); *G02F 1/133365* (2013.01); *G02F 1/157* (2013.01); *H01L 27/322* (2013.01)

(58) Field of Classification Search
CPC ..... H01L 27/3232; H01L 27/322; G02B 5/30; G02F 1/13378; G02F 1/133365; G02F 1/157

See application file for complete search history.

(56) References Cited

U.S. PATENT DOCUMENTS

| 7,477,330 | B2 * | 1/2009 | Magnusson ....... G02F 1/133528 |
| | | | 2/8.8 |
| 7,714,957 | B2 * | 5/2010 | Momoi ............. G02F 1/133753 |
| | | | 349/106 |

(Continued)

FOREIGN PATENT DOCUMENTS

| CN | 2682768 | 3/2005 |
| CN | 1759332 | 4/2006 |

(Continued)

OTHER PUBLICATIONS

Written Opinion of the International Searching Authority from corresponding PCT Application No. PCT/CN2015/078747 (4 pages); Oct. 10, 2015.

(Continued)

*Primary Examiner* — William Coleman
(74) *Attorney, Agent, or Firm* — Harness, Dickey & Pierce, P.L.C.

(57) ABSTRACT

A display apparatus comprising an anisotropic absorption layer and a display panel is disclosed. The anisotropic absorption layer is arranged at light-emitting side of the display panel. A predefined angle is formed between an absorption axis of the anisotropic absorption layer and a normal of the display panel. The anisotropic absorption layer is adapted to absorb ambient lights and transmit display lights from the display panel. The anisotropic absorption layer has a high absorptance to the ambient lights and a high transmittance to the display lights, such that the display apparatus can reduce influence of the ambient lights and improve energy usage.

18 Claims, 3 Drawing Sheets

(51) Int. Cl.
*G02F 1/1333* (2006.01)
*G02F 1/1337* (2006.01)

(56) References Cited

U.S. PATENT DOCUMENTS

| | | | | |
|---|---|---|---|---|
| 7,791,271 B2* | 9/2010 | Cok | .................. | H01L 27/322 |
| | | | | 313/506 |
| 8,472,115 B2* | 6/2013 | Suzuki | .................. | G02F 1/0136 |
| | | | | 359/487.02 |
| 8,999,195 B2* | 4/2015 | Chu | .................. | C09K 19/02 |
| | | | | 252/299.01 |
| 9,322,956 B2* | 4/2016 | Ibn-Elhaj | .......... | G02F 1/133711 |
| 2006/0186803 A1 | 8/2006 | Lim et al. | | |
| 2009/0201583 A1 | 8/2009 | Kamada et al. | | |
| 2010/0150513 A1 | 6/2010 | Zhang et al. | | |
| 2011/0128477 A1 | 6/2011 | Izaki et al. | | |
| 2011/0176304 A1 | 7/2011 | Kim et al. | | |
| 2011/0255303 A1* | 10/2011 | Nichol | .................. | G02B 6/006 |
| | | | | 362/606 |
| 2012/0007106 A1 | 1/2012 | Jung et al. | | |
| 2012/0075568 A1* | 3/2012 | Chang | .................. | G02B 5/3016 |
| | | | | 349/194 |
| 2012/0280612 A1 | 11/2012 | Lee et al. | | |
| 2012/0300160 A1* | 11/2012 | Lee | .................. | G02B 3/005 |
| | | | | 349/106 |
| 2012/0320298 A1* | 12/2012 | Suzuki | .................. | G02F 1/133553 |
| | | | | 349/43 |
| 2015/0109597 A1* | 4/2015 | Schmitt | .................. | G02B 5/3025 |
| | | | | 355/71 |
| 2015/0357597 A1 | 12/2015 | Wang | | |
| 2016/0271894 A1* | 9/2016 | Tang | .................. | B29D 11/0074 |

FOREIGN PATENT DOCUMENTS

| | | |
|---|---|---|
| CN | 1875300 | 12/2006 |
| CN | 101467080 | 6/2009 |
| CN | 101578348 | 11/2009 |
| CN | 102081254 | 6/2011 |
| CN | 103207426 | 7/2013 |
| CN | 103296053 | 9/2013 |
| CN | 103443211 | 12/2013 |
| CN | 104570538 | 4/2015 |
| WO | 2005/045485 | 5/2005 |
| WO | 2009/005330 | 1/2009 |

OTHER PUBLICATIONS

Office Action from corresponding Chinese Application No. 201510039575.9, Mar. 31, 2017 (6 pages).

* cited by examiner

DISPLAY APPARATUS

TECHNICAL FIELD

The present invention relates to display technology, and in particular, to a display apparatus.

BACKGROUND

Organic Light-Emitting Diode (OLED) devices have broad application prospects and have been widespread concerned due to their characteristics such as self-illumination, high-brightness, high efficiency, low weight and small thickness, wide view angle, easy manufacturing and the like, as well as their advantages such as low drive voltage, easy production in large scale, full-color display and the like. However, the characteristics such as high-brightness, high contrast, and low power consumption, are prone to be affected by ambient lights, and thus the display quality would be decreased. At present, a technical solution commonly used to overcome the above problem is to attach a layer of circular polarizer on the OLED display. With such the solution, the ambient lights reflected by, in particular, metal reflection electrodes are absorbed by the circular polarizer, and therefore the contrast and the display effect can be improved. However, transmittance of a circular polarizer is generally about 42~44%, which means that more than a half of display lights emitted from the OLED display is obstructed or absorbed by the circular polarizer, therefore more than a half of energy is lost. Due to this fact, the existing technical solution dramatically destroys the advantage of power saving brought by the self-illumination of the OLED display.

SUMMARY

Embodiments of the present invention provide a display apparatus which solves the problems that the existing display apparatus has low transmittance to the display lights while reducing the inference of the ambient lights, which thus causes energy loss.

To this end, an embodiment of the present invention provides a display apparatus, which comprises an anisotropic absorption layer and a display panel. The anisotropic absorption layer is arranged at the light-emitting side of the display panel. A predefined angle is formed between an absorption axis of the anisotropic absorption layer and a normal of the display panel. The anisotropic absorption layer is adapted to absorb the ambient lights and transmit the display lights from the display panel.

In an embodiment of the present invention, the display apparatus may further comprise a scattering layer which is arranged at outer side of the anisotropic absorption layer and adapted to change emitting directions of the display lights from the anisotropic absorption layer such that the display lights have different emitting directions.

In an embodiment of the present invention, the scattering layer does not backscatter the display lights and haze of the scattering layer is in a range from 10% to 40%.

In an embodiment of the present invention, the predefined angle is in a range from 0° to 30°.

In an embodiment of the present invention, the anisotropic absorption layer is made of a first material and a second material to which the first material is attached. The first material is adapted to absorb lights, and the second material is adapted to directionally arrange the first material by an alignment such that the predefined angle is formed between the absorption axis of the anisotropic absorption layer and the normal of the display panel.

In an embodiment of the present invention, the first material is black organic dye and the second material is liquid crystal.

In an embodiment of the present invention, the anisotropic absorption layer is made of a third material on which functional group is arranged. The functional group is adapted to absorb lights, and the third material is adapted to directionally arrange the functional group by an alignment such that the predefined angle is formed between the absorption axis of the anisotropic absorption layer and the normal of the display panel.

In an embodiment of the present invention, the display apparatus is a top-emitting white OLED display apparatus comprising a color filter and a black matrix.

In an embodiment of the present invention, the alignment comprises photo alignment, voltage alignment or rubbing alignment.

In an embodiment of the present invention, the third material comprises liquid crystal polymer.

In an embodiment of the present invention, the anisotropic absorption layer is made of nano-tubes.

In an embodiment of the present invention, the nano-tubes comprise silicon nano-tubes or silicon dioxide nano-tubes.

In an embodiment of the present invention, a fourth material is arranged on the surfaces of the nano-tubes and adapted to absorb lights.

In an embodiment of the present invention, the fourth material is nano silver.

In an embodiment of the present invention, the thickness of the fourth material is in a range from 1 nm to 10 um.

The embodiment of the present invention has the following advantages:

The display apparatus according to the embodiment of the present invention comprises the anisotropic absorption layer and the display panel. The anisotropic absorption layer is arranged at the light-emitting side of the display panel. A predefined angle is formed between the absorption axis of the anisotropic absorption layer and the normal of the display panel. The anisotropic absorption layer absorbs the ambient lights and transmits the display lights from the display panel. The anisotropic absorption layer has high absorptance to the ambient lights as well as the high transmittance to the display lights such that the display apparatus can decrease the influence of the ambient lights and improve the availability of the energy.

DETAILED DESCRIPTION

To facilitate better understanding of the embodiments of the present invention, the display apparatus according to the embodiments of the present invention will be described in detail in conjunction with the drawings.

First Embodiment

Figure 1:
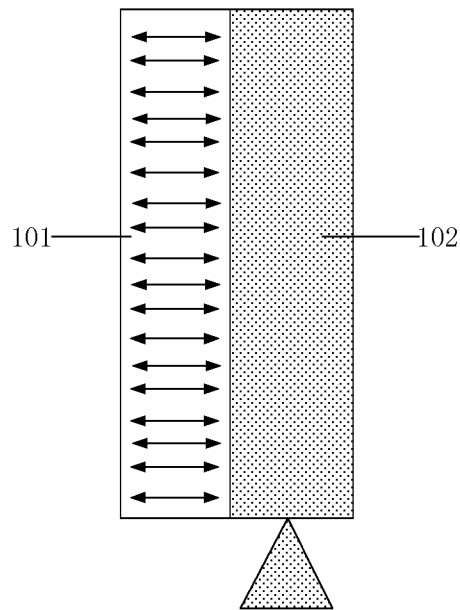
FIG. 1 is a structural schematic diagram of the display apparatus according to a first embodiment of the present invention.

FIG. 1 is a structural schematic diagram of the display apparatus according to the first embodiment of the present invention. As shown in FIG. 1, the display apparatus comprises an anisotropic absorption layer 101 and a display panel 102. The anisotropic absorption layer 101 is arranged at the light-emitting side of the display panel 102. A predefined angel is formed between the absorption axis of the anisotropic absorption layer 101 and the normal of the display panel 102. The anisotropic absorption layer 101 is adapted to absorb the ambient lights and transmit the display lights from the display panel. The predefined angle is configured such that the anisotropic absorption layer 101 has the highest absorptance to the ambient lights and has the highest transmittance to the display lights. Furthermore, the anisotropic absorption layer 101 has the highest absorptance to the lights parallel to its absorption axis. Therefore, the anisotropic absorption layer 101 has the high absorptance to the ambient lights as well as the high transmittance to the display lights, such that the influence of the ambient lights on the display apparatus can be decreased and the energy usage can be increased.

Figure 2:
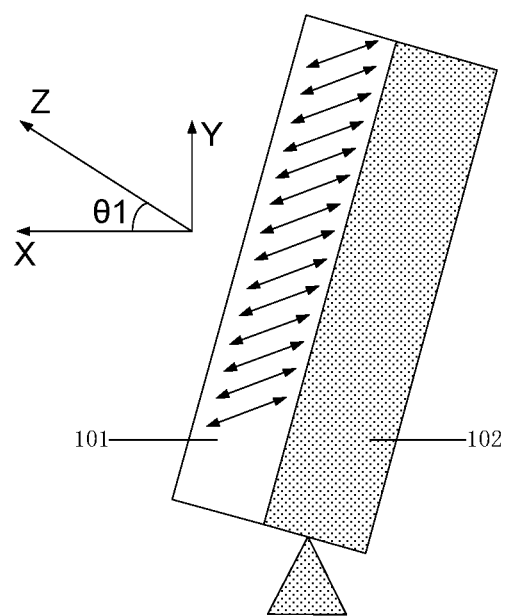
FIG. 2 is a diagram illustrating the absorption of the ambient lights by the display apparatus shown in FIG. 1.

FIG. 2 is a diagram illustrating the absorption of the ambient lights by the display apparatus shown in FIG. 1. As shown in FIG. 2, the anisotropic absorption layer 101 is arranged at the light-emitting side of the display panel 102, and the predefined angle is formed between the absorption axis thereof and the normal of the display panel 102. In this embodiment, the display apparatus is a laptop computer. The best view direction for the user is X-axis direction, and the direction in which the ambient lights have the greatest influence on the display apparatus is Z-axis direction. The angle θ1 between the X-axis direction and the Z-axis direction is 30°, and the Y-axis direction is perpendicular to the X-axis direction. The predefined angle is formed between the absorption axis of the anisotropic absorption layer 101 and the normal of the display panel 102, such that the anisotropic absorption layer 101 has the highest absorptance to the ambient lights and has the highest transmittance to the display lights. Preferably, the predefined angle may be varied in a range from 0° to 30°. In practice, with respect to the display lights, the anisotropic absorption layer 101 has the transmittance of nearly 100% in the X-axis direction, and has the transmittance of 30% in the Y-axis direction. As compared to the case in which no anisotropic absorption layer 101 is arranged, the ambient lights that pass through the anisotropic absorption layer 101 and reach the display panel 102 are decreased to about 54%.

In this embodiment, the display apparatus may comprise a liquid crystal display or an OLED display. Preferably, the OLED display is a top-emitting white OLED display and comprises a color filter and a black matrix. In the case where no anisotropic absorption layer is arranged, the OLED display has the reflectivity of 20%~30% to the ambient lights. In the case where the anisotropic absorption layer according to the present embodiment is arranged, the reflectivity of the OLED display to the ambient lights may be decreased to 10.8%~16.8% because the anisotropic absorption layer absorbs a part of the ambient lights such that the ambient lights passing through the anisotropic absorption layer and reaching the display panel are reduced. Furthermore, since the anisotropic absorption layer does not absorb the lights emitting in the user's best view direction, the OLED display of the present embodiment can improve the energy usage while reducing the interference of the ambient lights.

Figure 3:
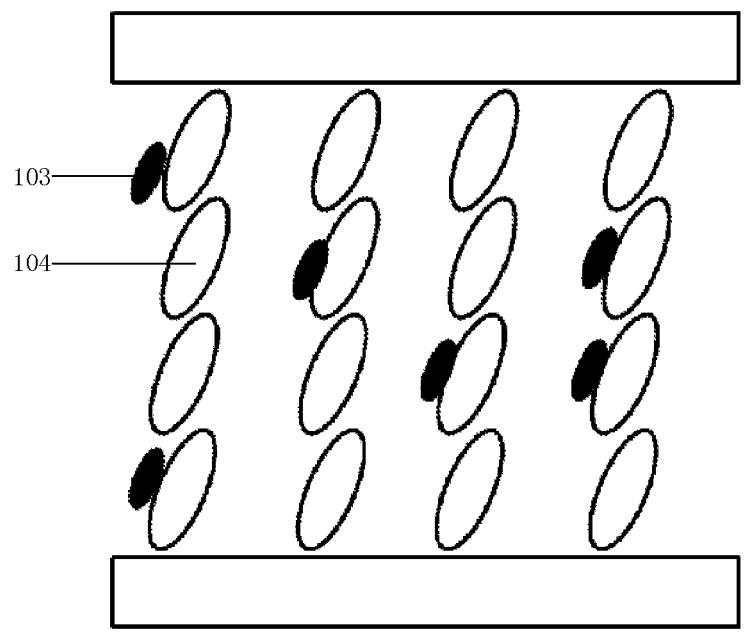
FIG. 3 is a structural schematic diagram of an exemplary anisotropic absorption layer in the first embodiment.

In the present embodiment, the anisotropic absorption layer 101 is made of a first material and a second material to which the first material is attached. The first material is adapted to absorb lights, and the second material is adapted to directionally arrange first material by an alignment to form the predefined angle. FIG. 3 is a structural diagram of an exemplary anisotropic absorption layer in the first embodiment. As shown in FIG. 3, the first material 103 having an absorption function and the second material 104 having an alignment function are arranged between the opposed substrates. The first material 103 is attached to the second material 104 in the manner of physical adsorption or chemical bonding. The absorption direction of the first material 103 is controlled by the alignment direction of the second material. Preferably, the first material 103 is black organic dye and the second material is liquid crystal. The second material 104 is aligned to form the predefined angle such that the anisotropic absorption layer 101 has the highest absorptance to the ambient lights as well as the highest transmittance to the display lights. The alignment may comprise photo alignment, voltage alignment or rubbing alignment.

In a variant of the present embodiment, the anisotropic absorption layer 101 may be made of a third material on which a functional group is arranged. The functional group is adapted to absorb lights, and the third material is adapted to directionally arrange the functional group by an alignment such that a predefined angle is formed between the absorption axis of the anisotropic absorption layer 101 and the normal of the display panel 102. The predefined angle is configured such that the anisotropic absorption layer 101 has the highest ambient lights absorptance as well as the highest transmittance to the display lights. Furthermore, the anisotropic absorption layer 101 has the highest lights absorptance to the lights parallel to its absorption axis. The absorption direction of the functional group is controlled by the alignment direction of the third material. Preferably, the third material comprises liquid crystal polymer. In practice, the anisotropic absorption layer is made of the third material having an alignment function on which the functional group having an absorption function is arranged. The third material is aligned to form the predefined angle such that the anisotropic absorption layer 101 has the highest absorptance to the ambient lights and has the highest transmittance to the display lights. The alignment may comprise photo alignment, voltage alignment or rubbing alignment.

Figure 4:
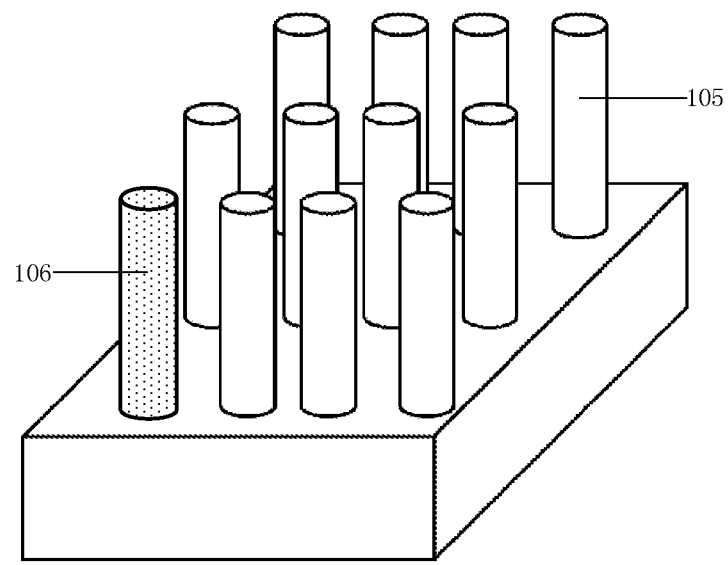
FIG. 4 is a structural schematic diagram illustrating another exemplary anisotropic absorption layer in the first embodiment.

FIG. 4 is a structural schematic diagram illustrating another exemplary anisotropic absorption layer in the first embodiment. As shown in FIG. 4, the anisotropic absorption layer is made of nano-tubes 105. Preferably, the nano-tubes comprise silicon nano-tubes or silicon dioxide nano-tubes. Preferably, a fourth material 106 is arranged on the surfaces of the nano-tubes for absorbing lights. The thickness of the fourth material 106 is in the range from 1 nm to 10 um. Preferably, the fourth material 106 is nano silver.

In the present embodiment, firstly a structurally fragile peeling layer may be formed on a Si wafer by using ion implantation technology, and then the peeling layer may be etched using aluminum oxide nano-particles as an etching mask so as to form silicon nano-tubes.

Alternatively, after the formation of the silicon nano-tubes, a high temperature oxygen diffusion process may be performed on the silicon nano-tubes so as to form silicon dioxide nano-tubes. Preferably, the fourth material 106 is formed on the surfaces of the silicon dioxide nano-tubes to absorb the lights. The thickness of the fourth material 106 is in a range from 1 nm to 10 um. Preferably, the fourth material 106 is nano silver.

The display apparatus according to the embodiment of the present invention comprises the anisotropic absorption layer and the display panel. The anisotropic absorption layer is arranged at the light-emitting side of the display panel. The predefined angle is formed between the absorption axis of the anisotropic absorption layer and the normal of the display panel. The anisotropic absorption layer absorbs the ambient lights and transmits the display lights from the display panel. The anisotropic absorption layer has high absorptance to the ambient lights as well as high transmittance to the display lights, such that the display apparatus can decrease the influence of the ambient lights while improve the energy usage. It should be noted that in the embodiment, after the anisotropic absorption layer is arranged, the fourth material 106 in the anisotropic absorption layer would absorb a part of the display lights from the display panel, but the fourth material 106 has the lowest absorptance to the display lights due to the predefined angle. Therefore, both the high absorptance to the ambient lights and the high transmittance to the display lights can be obtained.

Second Embodiment

Figure 5:
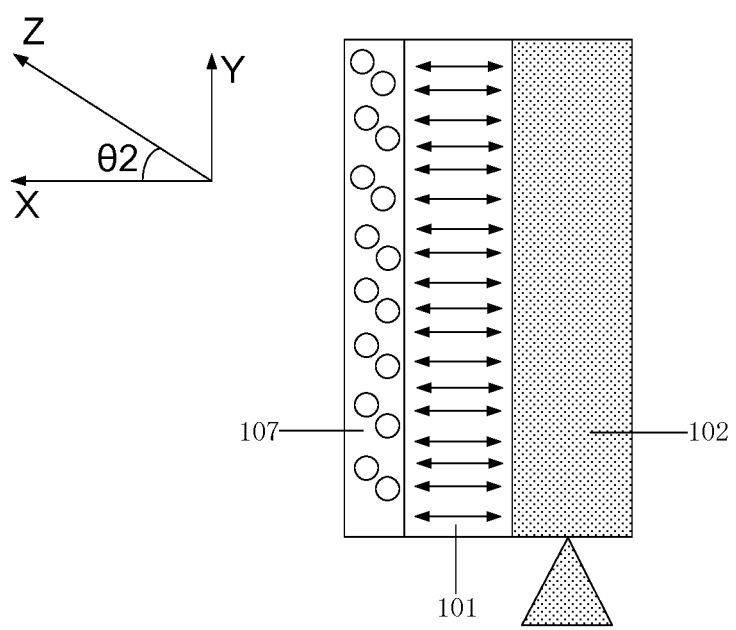
FIG. 5 is a diagram illustrating the absorption of the ambient lights by the display apparatus according to a second embodiment.

FIG. 5 is a diagram illustrating the absorption of the ambient lights by the display apparatus according to the second embodiment. As shown in FIG. 5, the display apparatus comprises the anisotropic absorption layer 101 and the display panel 102. The anisotropic absorption layer 101 is arranged at the light-emitting side of the display panel 102. The predefined angel is formed between the absorption axis of the anisotropic absorption layer 101 and the normal of the display panel 102. The anisotropic absorption layer 101 is adapted to absorb the ambient lights and transmit the display lights from the display panel. The predefined angle is configured such that the anisotropic absorption layer 101 has the highest absorptance to the ambient lights as well as the highest transmittance to the display lights. Furthermore, the anisotropic absorption layer 101 has the highest absorptance to the lights parallel to its absorption axis. Therefore, the anisotropic absorption layer 101 has the high absorptance to the ambient lights as well as the high transmittance to the display lights such that the influence of the ambient lights on the display apparatus can be decreased and the energy usage can be increased.

In the existing display apparatus, the scattering layer is commonly arranged at the light-emitting side of the display panel to scatter the display lights. In practice, after the display lights entering into the scattering layer, most of the display lights are scattered forwards (to the light-emitting side) but a part thereof may be scattered backwards (to the light-incident side of the scattering layer). The larger the diffusivity, for example the haze, of the scattering layer is, the more back scattering the scattering layer has. When the back scattering of the scattering layer is greater, the display image of the display panel will become white and thus it is difficult to display an image with contrast. Therefore, the display apparatus according to the embodiment of present invention further comprises the scattering layer 107 arranged at the outer side of the anisotropic absorption layer 101 and adapted to change the emitting directions of the display lights such that that display lights have different emitting directions. Preferably, the scattering layer 107 does not back-scatter the display lights and its haze is between 10% and 40%. The scattering layer in the present embodiment can not only increase the diffusivity for the display lights but also eliminate the back scattering of the display lights. The increase of the diffusivity for the display lights can make the quality of the displayed image that people can see from various angles to be identical, and the elimination of the back scattering can prevent the displayed image from becoming white so as to improve the contrast of the displayed image.

In the present embodiment, the best view direction for the user is X-axis direction, and the direction in which the ambient lights have the greatest influence on the display apparatus is Z-axis direction. The angle between the X-axis direction and the Z-axis direction is in a range from 0° to 30°, and the Y-axis direction is perpendicular to the X-axis direction. The X-axis direction is same as the normal of the display panel. The predefined angle is formed between the absorption axis of the anisotropic absorption layer 101 and the normal of the display panel 102, such that the anisotropic absorption layer 101 has the highest absorptance to the ambient lights and the highest transmittance to the display lights. Preferably, the predefined angle is in a range from 0° to 30°.

In this embodiment, the display apparatus may comprise a liquid crystal display or an OLED display. Preferably, the OLED display is a top-emitting white OLED display and comprises a color filter and a black matrix. In the case where the angle θ2 between the X-axis direction and the Z-axis direction is 0°, the lights are emitted in the X-axis direction. The anisotropic absorption layer 101 does not absorb the lights emitted in the X-axis direction. The emitting directions of the lights would change at a certain angle after the lights pass through the scattering layer 107, but no lights are reversed in direction. Therefore, the display apparatus provided with the scattering layer 107 can improve the brightness and view angle without loss of the overall energy.

When the angle θ2 between the X-axis and the Z-axis direction is 30°, as described in the first embodiment, the anisotropic absorption layer 101 has the transmittance of nearly 100% in the X-axis direction, and has the transmittance of 30% in the Y-axis direction. Therefore, as compared to the case in which no anisotropic absorption layer 101 is arranged, the ambient lights that pass through the anisotropic absorption layer 101 and reach the display panel 102 are decreased to about 54%. Since the anisotropic absorption layer does not absorb the lights emitted in the user's best view direction and partly absorbs the ambient lights not parallel to the normal, the OLED display according to the present embodiment can not only decrease the interference of the ambient lights but also improve the usage of energy.

In this embodiment, the anisotropic absorption layer 101 is made of the first material and the second material to which the first material is attached. The first material is adapted to absorb lights, and the second material is adapted to directionally arrange the first material by an alignment to form the predefined angle. Referring to FIG. 3, the first material 103 having the absorption function and the second material 104 having the alignment function are arranged between the opposed substrates. The first material 103 is attached to the second material 104 in the manner of physical adsorption or chemical bonding. The absorption direction of the first material 103 is controlled by the alignment direction of the second material. Preferably, the first material 103 is black organic dye and the second material is liquid crystal. The second material 104 is aligned to form the predefined angle such that the anisotropic absorption layer 101 has the highest absorptance to the ambient lights and the highest transmittance to the display lights. The alignment may comprise photo alignment, voltage alignment or rubbing alignment.

In a variant of the present embodiment, the anisotropic absorption layer 101 may be made of a third material on which a functional group is arranged. The functional group is adapted to absorb lights, and the third material is adapted to directionally arrange the functional group by an alignment such that a predefined angle is formed between the absorption axis of the anisotropic absorption layer 101 and the normal of the display panel 102. The predefined angle is configured such that the anisotropic absorption layer 101 has the highest absorptance to the ambient lights as well as the highest transmittance to the display lights. Furthermore, the anisotropic absorption layer 101 has the highest absorptance to the lights parallel to its absorption axis. The absorption direction of the functional group is controlled by the alignment direction of the third material. Preferably, the third material comprises liquid crystal polymer. In practice, the anisotropic absorption layer may be made of the third material having an alignment function on which the functional group having an absorption function is arranged. The third material is aligned to form the predefined angle such that the anisotropic absorption layer 101 has the highest absorptance to the ambient lights and the highest transmittance to the display lights. The alignment may comprise photo alignment, voltage alignment or rubbing alignment.

Referring to FIG. 4, the anisotropic absorption layer is made of nano-tubes. Preferably, the nano-tubes comprise silicon nano-tubes or silicon dioxide nano-tubes 105. Preferably, a fourth material 106 is arranged on the surfaces of the nano-tubes and adapted to absorb the lights. The thickness of the fourth material 106 is in the range from 1 nm to 10 um. Preferably, the fourth material 106 is nano silver.

In this embodiment, firstly a structurally fragile peeling layer may be formed on a Si wafer by using ion implantation technology, and then the peeling layer may be etched using aluminum oxide nano-particles as an etching mask so as to form the silicon nano-tubes. Alternatively, after the formation of the silicon nano-tubes, a high temperature oxygen diffusion process may be performed on the silicon nano-tubes so as to form silicon dioxide nano-tubes. Preferably, the fourth material 106 is formed on the surfaces of the silicon dioxide nano-tubes to absorb the lights. The thickness of the fourth material 106 is in a range from 1 nm to 10 um. Preferably, the fourth material 106 is nano silver.

The display apparatus according to the embodiment of the present invention comprises the anisotropic absorption layer and the display panel. The anisotropic absorption layer is arranged at the light-emitting side of the display panel. The predefined angle is formed between the absorption axis of the anisotropic absorption layer and the normal of the display panel. The anisotropic absorption layer absorbs the ambient lights and transmits the display lights from the display panel. The anisotropic absorption layer has a high absorptance to the ambient lights as well as a high transmittance to the display lights such that the display apparatus can decrease the influence of the ambient lights while improve the usage of the energy. It should be noted that in the embodiment, after the anisotropic absorption layer is arranged, the fourth material 106 in the anisotropic absorption layer would absorb a part of the display lights from the display panel, but the fourth material 106 has the lowest absorptance to the display lights due to the predefined angle. Therefore, both the high absorptance to the ambient lights and the high transmittance to the display lights can be obtained.

It can be appreciated that the above embodiments are only exemplary embodiments for illustrating the principle of the present invention and the present invention is not limited thereto. Without departing from the spirit and essence of the present invention, one of ordinary skill in the art may make various variation and modification that should be deemed in the scope of the present invention.

What is claimed is:

1. A display apparatus, comprising:
   an anisotropic absorption layer; and
   a display panel;
   the anisotropic absorption layer arranged at a light-emitting side of the display panel, a predefined angle larger than zero degrees but not larger than thirty degrees formed between an absorption axis of the anisotropic absorption layer and a normal line to the display panel, and the anisotropic absorption layer adapted to absorb ambient lights and transmit display lights from the display panel.

2. The display apparatus according to claim 1, further comprising a scattering layer arranged at an outer side of the anisotropic absorption layer and adapted to change emitting directions of the display lights from the anisotropic absorption layer such that the display lights have different emitting directions.

3. The display apparatus according to claim 1, wherein:
   the anisotropic absorption layer is made of a first material and a second material to which the first material is attached;
   the first material is adapted to absorb lights; and
   the second material is adapted to directionally arrange the first material by alignment such that the predefined angle is formed between the absorption axis of the anisotropic absorption layer and the normal line to the display panel.

4. The display apparatus according to claim 1, wherein:
   the anisotropic absorption layer is made of a third material on which a functional group is arranged;
   the functional group is adapted to absorb lights; and
   the third material is adapted to directionally arrange the functional group by an alignment such that the predefined angle is formed between the absorption axis of the anisotropic absorption layer and the normal line to the display panel.

5. The display apparatus according to claim 1, wherein the display apparatus is a top-emitting white OLED display apparatus.

6. The display apparatus according to claim 1, wherein the anisotropic absorption layer is made of nano-tubes.

7. The display apparatus according to claim 2, wherein the scattering layer does not back scatter the display lights, and wherein haze of the scattering layer is in a range from 10% to 40%.

8. The display apparatus according to claim 3, wherein the first material is black organic dye and the second material is liquid crystal.

9. The display apparatus according to claim 3, wherein the alignment comprises photo alignment, voltage alignment or rubbing alignment.

10. The display apparatus according to claim 4, wherein the third material comprises liquid crystal polymer.

11. The display apparatus according to claim 4, wherein the alignment comprises photo alignment, voltage alignment or rubbing alignment.

12. The display apparatus according to claim 6, wherein the nano-tubes comprise silicon nano-tubes or silicon dioxide nano-tubes.

13. The display apparatus according to claim 6, wherein a fourth material is arranged on surfaces of the nano-tubes and adapted to absorb lights.

14. The display apparatus according to claim 12, wherein a fourth material is arranged on surfaces of the nano-tubes and adapted to absorb lights.

15. The display apparatus according to claim 13, wherein the fourth material is nano silver.

16. The display apparatus according to claim 13, wherein thickness of the fourth material is in a range from 1 nm to 10 um.

17. The display apparatus according to claim 14, wherein the fourth material is nano silver.

18. The display apparatus according to claim 14, wherein thickness of the fourth material is in a range from 1 nm to 10 um.

* * * * *